United States Patent [19]

Somer

[11] Patent Number: 5,039,956

[45] Date of Patent: Aug. 13, 1991

[54] FREQUENCY SYNTHESIZER FOR FREQUENCY AGILE MODEM

[75] Inventor: Gerald L. Somer, Sebastopol, Calif.

[73] Assignee: AMP Incorporated, Harrisburg, Pa.

[21] Appl. No.: 394,290

[22] Filed: Aug. 15, 1989

Related U.S. Application Data

[63] Continuation of Ser. No. 121,541, Nov. 17, 1987, abandoned.

[51] Int. Cl.[5] .................... H03L 7/99; H03B 5/12
[52] U.S. Cl. .................. 331/36 C; 331/117 R; 331/177 V; 375/8; 455/75
[58] Field of Search ............ 331/36 C, 117 R, 117 V; 455/262, 264, 318, 75, 76; 334/15; 332/127, 128, 136; 375/8, 9

[56] References Cited

U.S. PATENT DOCUMENTS

| | | | |
|---|---|---|---|
| 3,370,254 | 2/1968 | Keller | 331/177 V X |
| 3,400,338 | 9/1968 | Ishman | 332/30 V X |
| 3,959,728 | 5/1976 | Yamazaki et al. | 455/262 X |
| 4,229,822 | 10/1980 | Bench | 375/81 |
| 4,317,227 | 2/1982 | Skerlos | 455/180 |
| 4,484,153 | 11/1984 | Borras et al. | 331/10 |
| 4,703,286 | 10/1987 | Muterspaugh | 331/177 V X |
| 4,734,657 | 3/1988 | Somer | 331/116 |

FOREIGN PATENT DOCUMENTS 1319107 1/1963 France ................ 331/177 V

OTHER PUBLICATIONS

Rohde, U. L. "Diode Tuned Resonant Circuits", in: *Digital PLL Frequency Synthesizers* (Englewood Cliffs, N.J.; Prentice-Hall Inc.) pp. 170-173.

*Primary Examiner*—Siegfried H. Grimm
*Attorney, Agent, or Firm*—David L. Smith

[57] ABSTRACT

A diode tuned resonant circuit (42) with an inductor (L1) a first variable reactance diode (VAR1) connected in parallel with the inductor (L1), and a second variable reactance diode (VAR2) connected in series with the parallel combination of the inductor (L1) and first diode (VAR1) is used in an oscillator circuit. The resonant frequency of the circuit may be adjusted over a relatively broad frequency range while maintaining a relatively constant Q-factor by applying a biasing voltage to the first and second diodes (VAR1, VAR2).

3 Claims, 4 Drawing Sheets

FREQUENCY SYNTHESIZER FOR FREQUENCY AGILE MODEM

This application is a continuation of application Ser. No. 07/121,541 filed Nov. 17, 1987, now abandoned.

BACKGROUND OF THE INVENTION

The present invention relates to a diode tuned resonant circuit comprising at least two variable reactance diodes.

Tuned resonant circuits are frequently used in oscillators to vary the frequency of the oscillator in response to an applied voltage. Variable frequency oscillators are used in a variety of applications. One such application is in a frequency agile modem which connects a computer to a multi-channel network. Each channel is assigned a distinct frequency band within which data may be transmitted and/or received.

For modulation and demodulation operations, a modem typically uses a local oscillator to generate a signal of known frequency. The frequency of this signal must be very stable to accurately and reproducibly code and decode the communication data. Since a frequency agile modem may communicate over several frequency channels, it is desirable for that modem to have a local oscillator which can generate any one of several frequencies. In addition, if the modem is of the type which transmits and receives on different frequency channels, it is often desirable for the modem to contain two local oscillators, one for transmission, and one for reception operations.

One means for providing stable multi-frequency signals is to use an oscillator circuit which contains a crystal for each respective communication channel. An oscillator of this type would generate stable frequency signals. However, the additional crystals add considerably to the cost of the modem.

Another possibility is to use a frequency synthesizer. A frequency synthesizer circuit typically has one crystal to generate a stable frequency reference and a variable oscillator to generate an output signal at selectable frequencies based on the frequency reference. The frequency of the output signal is maintained stable by a feedback loop which compares the output frequency with the reference frequency and continuously provides appropriate correction to the oscillator.

Frequently, the variable oscillator of the synthesizer circuit comprises a diode tuned resonant circuit. The diode is generally of the varactor type whose capacitance (reactance) varies in response to an applied voltage. The frequency of the variable oscillator may therefore be varied by biasing the varactor diode with the correction voltage. The change in diode capacitance causes a corresponding change in the resonant frequency of the circuit.

Three basic diode tuned resonant circuits are well known and are disclosed in U. Rohde, *Digital PLL Frequency Synthesizers*, Prentice-Hall, New Jersey, 1983 and reproduced in FIGS. 1a–1c. FIG. 1a is a parallel resonant circuit with a tuner diode $C_D$ and load resistor $R_L$ parallel to a series capacitor $C_S$. FIG. 1b is a parallel resonant circuit with tuner diode $C_D$ and load resistor $R_L$ parallel to the diode $C_D$. And, FIG. 1c is a parallel resonant circuit with two tuner diodes $C_D$.

Each of the circuits in FIGS. 1a–1c allow the resonant frequency of the circuit to be altered. However, these circuits have the disadvantage that the range over which this alteration is useful in an oscillator circuit is relatively narrow because the Q-factor of these circuits, a measure of circuit performance, is relatively non-constant over their adjustable frequency range.

SUMMARY OF THE INVENTION

The present invention is directed to a diode tuned resonant circuit comprising variable reactance diodes wherein the resonant frequency of the circuit may be varied over a relatively broad range by applying a biasing voltage to the diodes.

According to a preferred embodiment of the present invention, the resonant circuit comprises two varactor diodes and a coil. One of the varactor diodes is in parallel with the coil and the other varactor diode is in series with the parallel combination of the first varactor diode and the coil.

The present invention provides an advantage over known variable resonant circuits in that the resonant frequency of the circuit may be adjusted over a relatively broad frequency range for a given diode while maintaining a relatively constant Q-factor, thereby allowing the use of commonly available and relatively inexpensive diodes.

The invention itself, together with further objects and attendant advantages, will best be understood by reference to the following detailed description, taken in conjunction with the accompanying drawings.

DETAILED DESCRIPTION OF THE DRAWINGS

DETAILED DESCRIPTION OF THE PRESENTLY PREFERRED EMBODIMENTS

Figure 2:
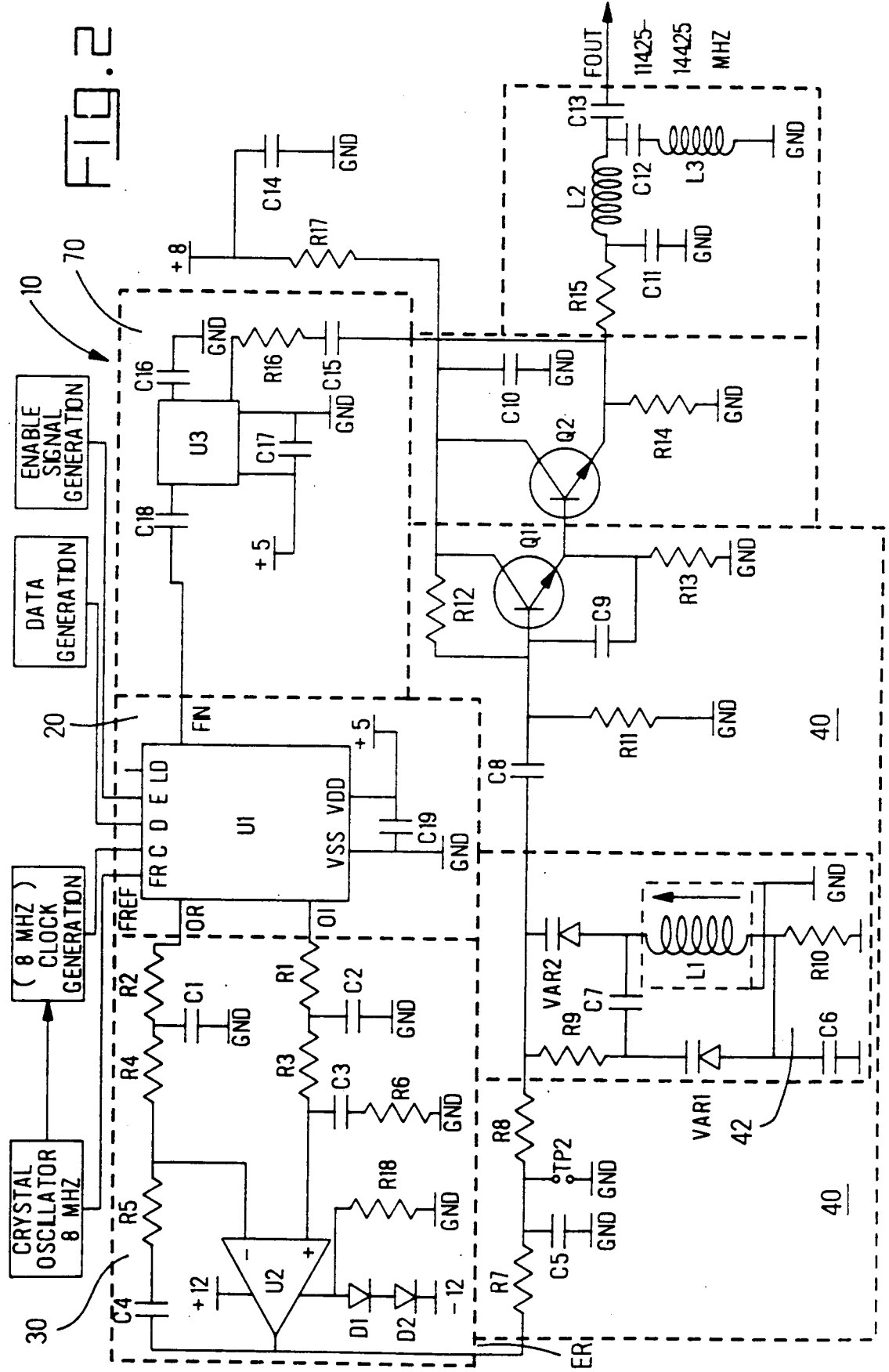
FIG. 2 is a schematic diagram of a first preferred embodiment of the present invention as part of a frequency synthesizer.

Turning now to the drawings, FIG. 2 is a schematic diagram of the preferred embodiment 42 configured as part of a frequency synthesizer 10. The preferred embodiment 42 is a diode tuned resonant circuit comprising two varactor diodes VAR1, VAR2, inductor L1, capacitors C6–C7 and resistors R9–R10. The first diode VAR1 is circuited parallel to the inductor L1. The second diode VAR2 is circuited in series with the combination of the first diode VAR1 and inductor L1.

Figure 3:
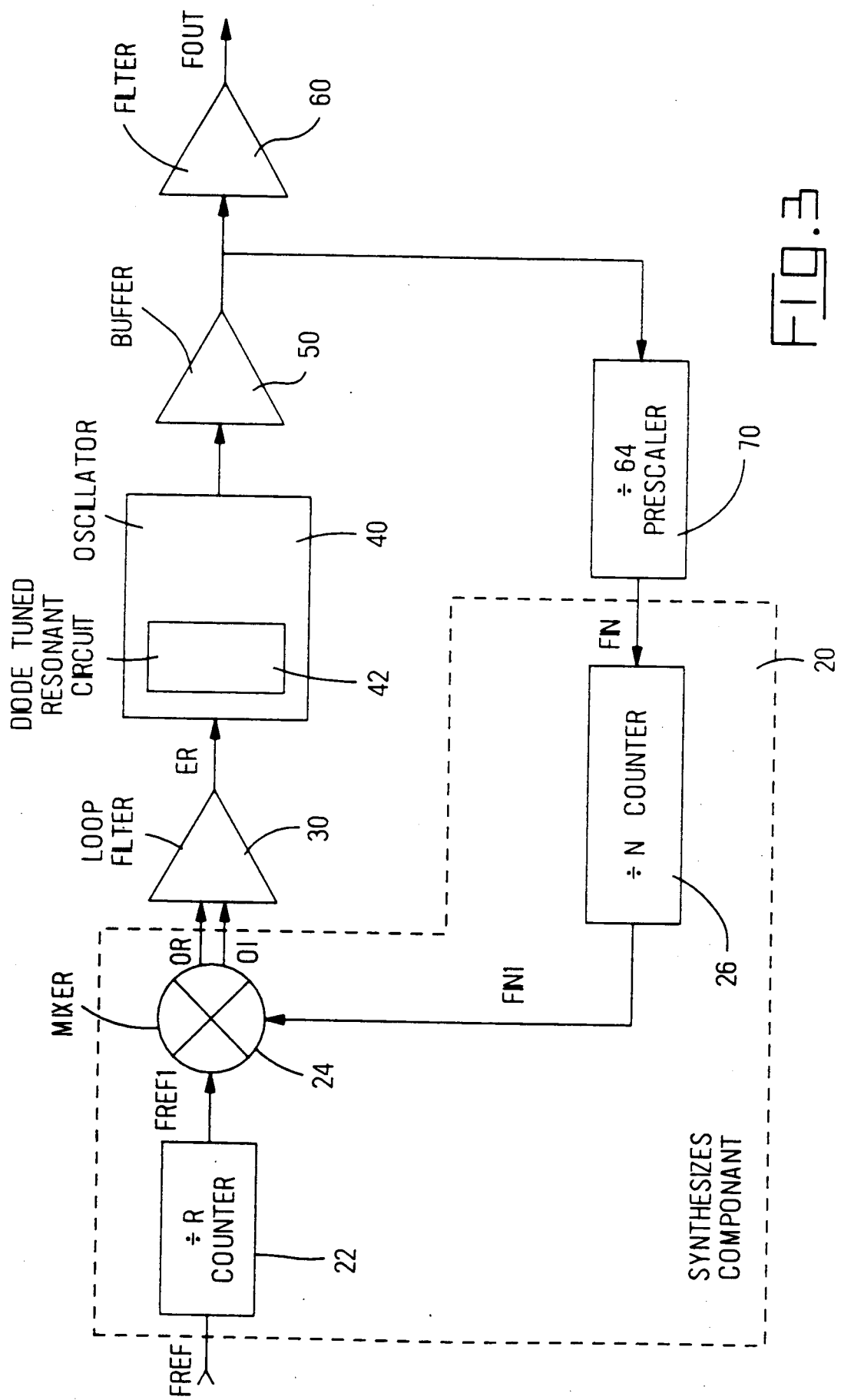
FIG. 3 is a block diagram representing the circuit of FIG. 2.

In addition to the diode tuned resonant circuit 42, the frequency synthesizer 10 comprises a serial input phase locked loop synthesizer component 20, a loop filter 30, an oscillator 40, a buffer 50, a filter 60 and a prescaler 70. Since the synthesizer 10 comprises integrated circuitry, a block diagram of the synthesizer 10 is shown in FIG. 3 to aid in understanding the circuit. Circuits and components similar in function to those shown in FIG. 2 are identified by like reference numerals.

The synthesizer component 20 comprises an integrated circuit U1 and decoupling capacitor C19. As shown in FIG. 3, the integrated circuit U1 contains a divide-by-R counter 22, a mixer 24 and a divide-by-N counter 26. Two digital words R, N may be stored within the circuit U1 for access by the counters 22, 26. The digital words R, N are serially applied to the circuit U1 at data input D from a data generation circuit. A clock signal from a clock generation circuit is supplied to the circuit U1 at clock input C to gate the data words R, N into the circuit U1. A control bit in the data words R, N determines into which counter 22, 26 the data words R, N are to be loaded. The words R, N are then latched into their designated counters 22, 26 by a pulse applied to the enable input E from an enable generation circuit.

The synthesizer component 20 receives a frequency reference signal $f_{ref}$ and a frequency input signal $f_{in}$. The signals $f_{ref}$, $f_{in}$ are scaled by the counters 22, 26 to generate intermediate signals $f_{ref1}$, $f_{in1}$, as shown in FIG. 3. The mixer 24 compares the signals $f_{ref1}$, $f_{in1}$ and produces two output signals Or, Oi.

If the frequency of $f_{in1}$ is greater than the frequency of $f_{ref1}$ or if the phase of $f_{in1}$ is leading, error information is provided by Oi pulsing low. If the frequency of $f_{in1}$ is less than $f_{ref1}$ 1 or if the phase of $f_{in1}$ is lagging, error information is provided by Or pulsing low. If the frequency of the signals $f_{in1}$ and $f_{ref1}$ 1 are equal and both signals $f_{in1}$ and $f_{ref1}$ 1 are in phase, Oi and Or remain high except for a small minimum time period when both pulse low in phase.

The error information signals Or, Oi are applied to the loop filter 30. The filter 30 comprises a differential input operational amplifier U2 and sums the outputs Or, Oi to produce a direct current (DC) error signal Er.

The feedback loop of the amplifier U2 is comprised of capacitor C4 and resistor R5 to provide a high DC gain. A small voltage fluctuation in the error information signals Or, Oi will therefore produce a large voltage swing in the error signal Er. Unwanted noise is reduced by the filtering circuit of resistors R1-R6 and capacitors C1-C4.

The error signal Er is conducted to the voltage controlled oscillator 40. The oscillator 40, in the preferred embodiment, is a Colpitts type oscillator and comprises transistor Q1, resistors R7, R8, R11-13, capacitors C5, C8, C9 and the tuned diode resonant circuit 42. Resistors R7, R8 and capacitor C5 assist in filtering out voltage spikes and unwanted noise produced by the synthesizer component 20 and other sources.

The diodes VAR1, VAR2 of the resonant circuit 42 are biased by the error signal Er generated by the loop filter 30. Each diode VAR1, VAR2 produces a small capacitance when strongly reverse biased and a large capacitance when only moderately reverse biased. To maintain the diodes VAR1, VAR2 sufficiently reverse biased that RF noise on the error signal Er does not adversely affect the oscillator 40, the error signal Er is prevented from going too negative by diodes D1, D2 and resistor R18. The diodes D1, D2 are connected in series between the negative supply input of amplifier U2 and the negative voltage supply. The voltage drop across the diodes D1, D2 limits the negative voltage swing of the error signal Er to −10 volts. In the preferred embodiment, the nominal voltage swing of the error signal Er is in the range +8 to −6 volts.

To prevent the biasing voltage of transistor Q1 from adversely affecting diodes VAR1, VAR2, a DC blocking capacitor C8 is used to connect the diode tuned resonant circuit 42 to the transistor Q1. Thus, the biasing of the diodes VAR1, VAR2 is entirely controlled by the error signal Er.

The output of the oscillator 40 provides the input to buffer 50 which is configured as an emitter-follower and comprises transistor Q2, resistor R14 and capacitor C10. Biasing and power for the transistors Q2 and Q1 is provided by resistor R17 and filtered by capacitor C14.

The output of the buffer 50 provides the input to the filter 60 and the prescaler 70. The filter 60 comprises resistor R15, capacitors C11-C13 and inductors L2-L3. These elements form a low pass notch filter to remove unwanted harmonics from the output of the frequency synthesizer 10.

The prescaler 70 comprises prescaler circuit U3, resistor R16, and capacitors C15-C17. Capacitor C15 and resistor R16 provide proper input signal conditioning for the prescaler circuit U3 which, in the preferred embodiment, is of MECL technology. The prescaler 70 used in this embodiment has two inputs, only one of which is needed in this application. Therefore, capacitor C16 is used to tie the unused second input of circuit U3 to AC ground. Capacitor C17 is a voltage supply filter and capacitor C18 is provided to properly connect the MECL circuit U3 with the circuit U1 which is of CMOS technology.

Figure 4:
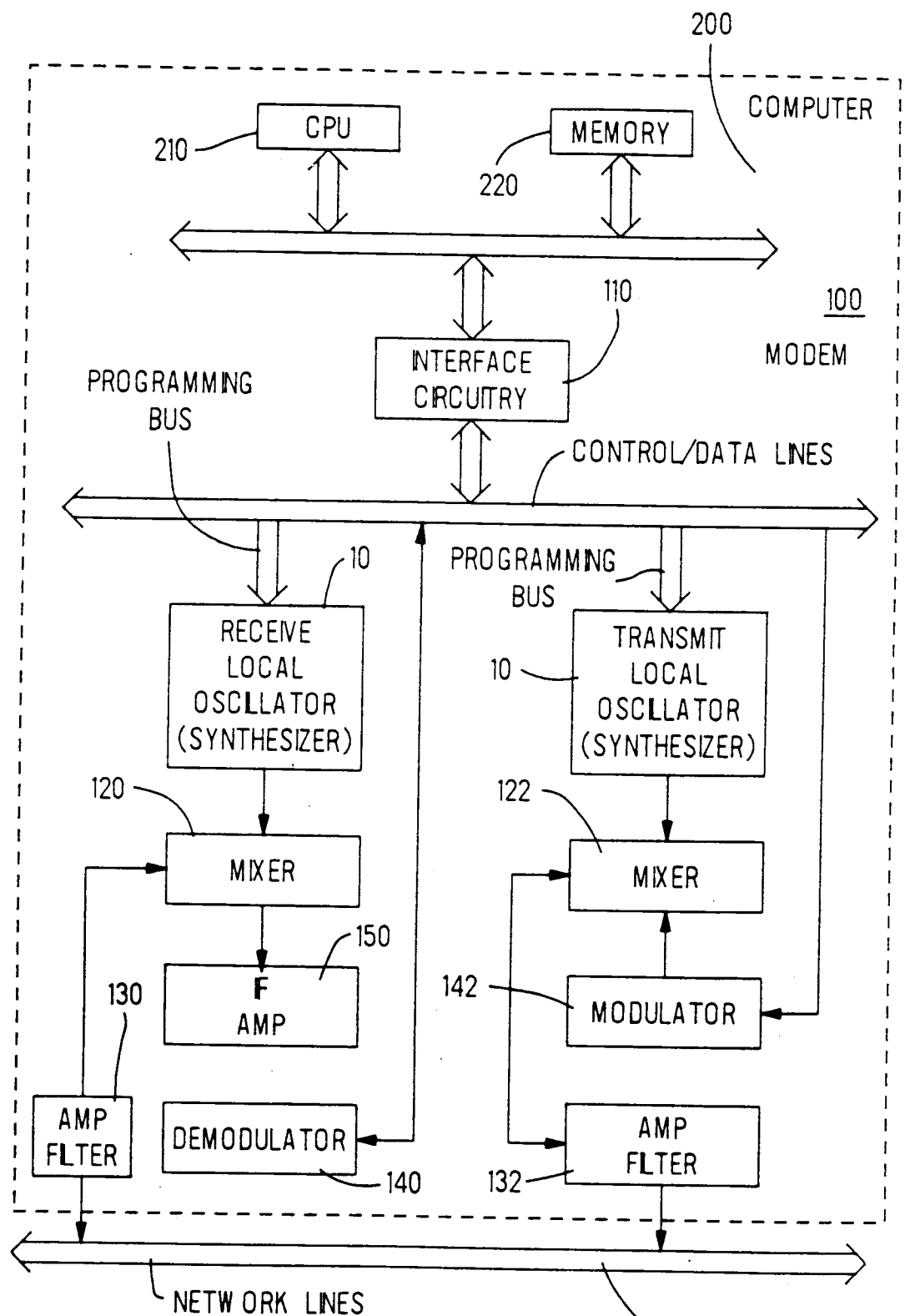
FIG. 4 is a block diagram representing use of the preferred embodiment in a modem.

One application for the frequency synthesizer 10 and tuned diode resonant circuit 42 is shown in FIG. 4. In this application, a first and second frequency synthesizer 10 serve as the local oscillators in a frequency agile modem 100. The modem 100 connects a computer 200 to a network line 300 for data communication. Interface circuitry 110 supplies the necessary data and control information to the synthesizers 10 and modulation-demodulation circuitry 120, 122, 130, 132, 140, 142, 150.

In operation, the central processing unit, CPU 210 of the computer 200 executes a program stored in memory 220 which initializes the modem 100 for communication. During the initialization, the data words R, N are retrieved from memory 220, or are calculated, by the CPU 210 and are used to set the frequency synthesizers 10 at frequencies corresponding to their respective assigned communication channels on the network.

The data words R, N are serially loaded and latched into the synthesizer component 20 which generates the appropriate error information Or, Oi. This error information is converted into the error signal Er and filtered. If the error information indicates a higher frequency should be produced, the loop filter 30 generates a higher DC voltage level on signal Er.

The DC voltage level produced by the filter 30 causes the varactor diodes VAR1, VAR2 to change reactance. The reactance of inductor L1 in parallel with diode VAR1, at the resonant frequency of the oscillator, appears to be inductive. The series reactance of diode VAR2 also appears to be inductive. Thus, the reactance of the tank circuit as a whole appears to be inductive and is reactive with the input capacitance and base-to-emitter capacitance C9 of transistor Q1. The change in reactance causes the oscillator 40 to change the frequency of its output signal. The output signal is buffered and prescaled down in frequency to be within the input frequency range of the synthesizer component 20. The error information Or, Oi produced by the synthesizer component 20 is appropriately adjusted and the cycle continuously repeated to produce a stable frequency output.

The output of the buffer 50 is applied to the low pass notch filter 60 to remove unwanted harmonics and then conducted to the respective mixers 120, 122 of the modem 100. Although the frequency of the output signal $f_{out}$ may be adjusted by changing either or both data words R, N, a common R value can generally be used for many conventional communication channels. Thus, the frequency of the output signal $f_{out}$ may be changed from channel to channel by merely altering the value of N. In the preferred embodiment $f_{out}$ is variable from 114.25-144.25 MHz.

To further illustrate the first preferred embodiment, and with no limitations to the invention intended, the following information is provided:

| Component | Value |
| --- | --- |
| R1-R4 | 11k ohms |
| R5-R6 | 33k ohms |
| R7-R10 | 10k ohms |
| R11 | 4.7k ohms |
| R12 | 3.9k ohms |
| R13 | 470 ohms |
| R14 | 220 ohms |
| R15 | 24 ohms |
| R16 | 1k ohms |
| R17 | 150 ohms |
| R18 | 10k ohms |
| C1-C2 | .022 UF |
| C3-C6 | .1 UF |
| C7-C8 | 1000 PF |
| C9 | 27 PF |
| C10 | 1000 PF |
| C11 | 33 PF |
| C12 | 22 PF |
| C13-C16 | 1000 PF |
| C17-C19 | .1 UF |
| D1 | 1N4154 |
| D2 | 1N4154 |
| VAR1 | MV2108 |
| VAR2 | MV2108 |
| Q1 | MPS918 |
| Q2 | MPS918 |
| L1 | .062 uh-.069 uh; .066 uh (nom.) |
| L2 | .068 uh |
| L3 | .033 uh |
| U1 | MC145157 |
| U2 | MC3458 |
| U3 | MC12073 |

| N (hexidecimal) | R (hexidecimal) | $f_{out}$ (MHz) |
| --- | --- | --- |
| 392 | 1000 | 114.25 |
| 3C2 | 1000 | 120.25 |
| 3FC | 1000 | 126.25 |
| 422 | 1000 | 132.25 |
| 452 | 1000 | 138.25 |
| 482 | 1000 | 144.25 |

Figure 1A:
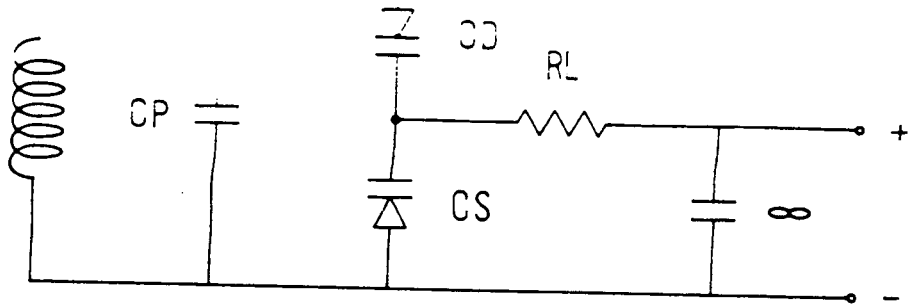
FIG. 1a is a schematic diagram of a known tuned resonant circuit with a tuner diode and load resistor parallel to a series capacitor.
Figure 1B:
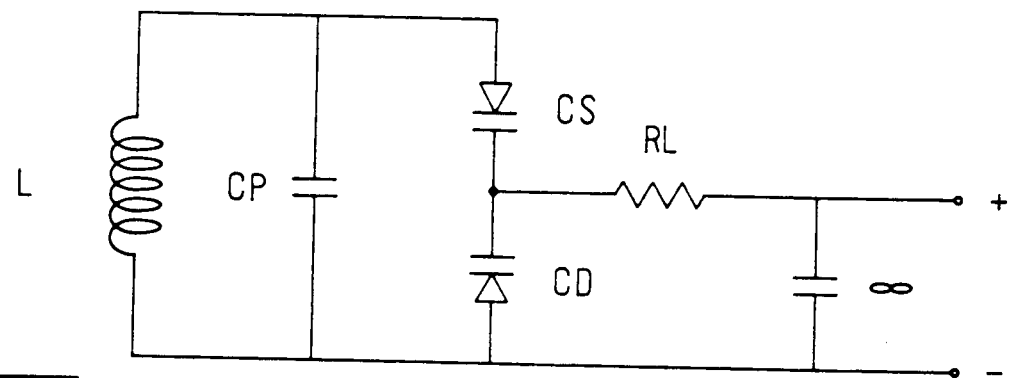
FIG. 1b is a schematic diagram of a known tuned resonant circuit with a load resistor parallel to a tuner diode.
Figure 1C:
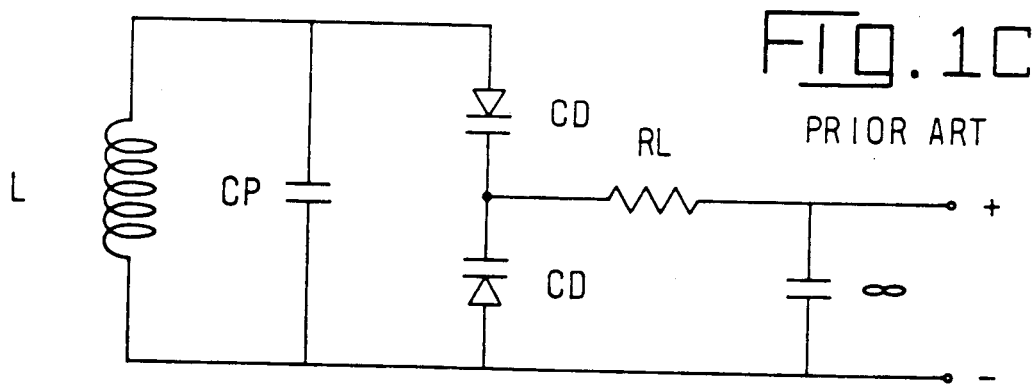
FIG. 1c is a schematic diagram of a known tuned resonant circuit with two tuner diodes.
Figure 5:
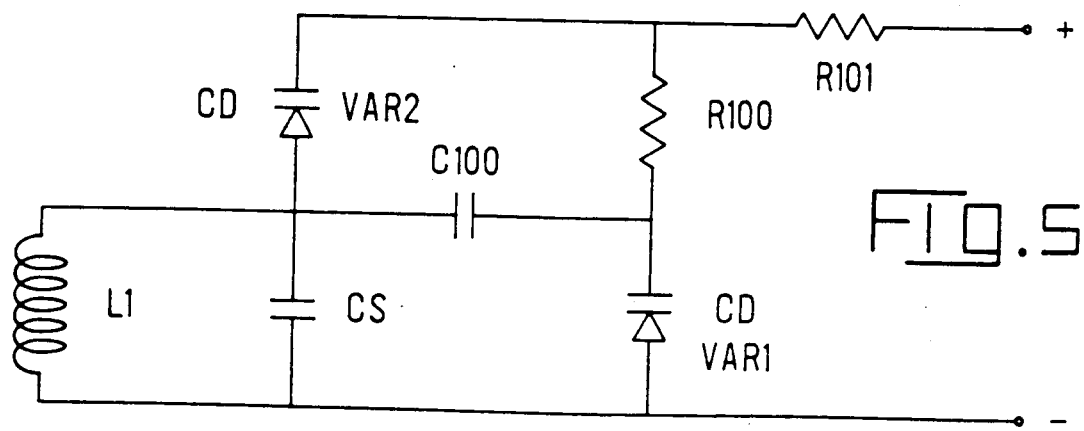
FIG. 5 is a schematic diagram of a second preferred embodiment.

An equivalent circuit of the first preferred embodiment is schematically shown in FIG. 5. This circuit also comprises a first and second varactor diode VAR1, VAR2 and an inductor L1 to form a tuned diode resonant circuit. As in the above-described embodiment, the first diode VAR1 is connected in parallel with the inductor L1 and the second diode VAR2 is connected in series with that combination. A DC blocking capacitor C100 connects the two diodes VAR1, VAR2. The capacitor $C_S$ represents the capacitance of the inductor L1 and any stray capacitance that may be present. Resistors R100, R101 provide proper biasing. There are no additional reactive components that contribute to the resonance of the circuit at the AC common point between VAR1 and VAR2.

Diodes VAR1, VAR2 alter their capacitance in response to an applied biasing voltage. When used in an oscillator circuit, this circuit allows the frequency of oscillation to be varied over a relatively broad range while maintaining a relatively constant Q-factor.

Of course, it should be understood that a wide range of changes and modifications can be made to the preferred embodiments described above. For example, discrete components could be substituted for the integrated circuits or the resistance and capacitance values could be altered or made variable. Additionally, the tuned resonant circuit could be used in applications other than modems and oscillators. Moreover, the preferred embodiments although shown as resonant circuits of a Colpitts type oscillator, may also be used in other types of oscillators such as Pierce and Clapp type oscillators. It is therefore intended that the foregoing detailed description be regarded as illustrative rather than limiting, and that it be understood that it is the following claims, including all equivalents, which are intended to define the scope of this invention.

I claim:

1. A frequency agile modem having a diode tuned resonant circuit with a frequency range and having frequency agility for establishing frequencies corresponding to respective assigned communication channels on a network in response to a bias voltage, the frequency agile modem comprising:

frequency synthesizer means for receiving a frequency reference signal and a frequency input signal, for comparing said signals and for generating first and second error information signals;

summing means for summing the first and second error information signals to provide an error signal;

a voltage controlled oscillator for receiving the error signal from the summing means and for producing the frequency reference signal, said voltage controlled oscillator including said diode tuned resonant circuit biased by the error signal, said diode tuned resonant circuit comprising;

means for producing an inductance;

a first variable reactance diode connected in parallel with the means for producing an inductance;

a second variable reactance diode connected in series with the combination of the means for producing an inductance and first variable diode and defining a junction at the common point therebetween, said junction having no additional reactive components that contribute to resonance of the circuit electrically in common therewith; and means for applying said error voltage as a biasing voltage to the first and second variable reactance diodes to alter their reactance characteristics and thereby alter the resonant frequency of the diode tuned resonant circuit, whereby the second variable reactance diode in series with the combination of the means for producing an inductance and the first variable reactance diode increases the frequency range of the resonant circuit.

2. A frequency agile modem as recited in claim 1, wherein the frequency agility comprises switching between at least two predetermined frequency communication channels.

3. A frequency agile modem as recited in claim 2, wherein each communication channel is assigned a predetermined frequency band.

* * * * *